United States Patent
Ohori

[11] Patent Number: 5,950,843
[45] Date of Patent: Sep. 14, 1999

[54] DEVICE FOR PREVENTING CONTACTING OF WAFERS IN WAFER CASSETTE

[75] Inventor: Shinichi Ohori, Niigata-ken, Japan

[73] Assignees: Shin-Etsu Polyer Co., Ltd.; Shin-Etsu Handotai Co., Ltd., both of Tokyo, Japan

[21] Appl. No.: 09/055,963

[22] Filed: Apr. 7, 1998

[30] Foreign Application Priority Data

Apr. 7, 1997 [JP] Japan .................................. 9-087875

[51] Int. Cl.[6] ...................................................... A47F 7/00
[52] U.S. Cl. .......................................... 211/41.18; 206/454
[58] Field of Search ............................... 211/41.18, 41.1, 211/41.14, 183; 206/454; 118/500

[56] References Cited

U.S. PATENT DOCUMENTS

| | | | |
|---|---|---|---|
| 4,718,552 | 1/1988 | Rossi et al. | 206/454 X |
| 5,269,422 | 12/1993 | Chevrette | 206/454 X |
| 5,350,069 | 9/1994 | Agwu | 211/41.14 X |
| 5,782,362 | 7/1998 | Ohori | 211/41.18 X |
| 5,833,067 | 11/1998 | Joshi | 206/454 |

*Primary Examiner*—Robert W. Gibson, Jr.
*Attorney, Agent, or Firm*—Wenderoth, Lind & Ponack, L.L.P.

[57] ABSTRACT

A device for preventing wafer materials, such as semiconductor silicon wafers, held on a wafer cassette by inserting the wafers into respective wafer alignment grooves from contacting with adjacent wafers due to the larger width of the grooves than the thickness of the wafers to allow tilting thereof. The device is a rectangular frame mountable on the wafer cassette and provided on each of two oppositely facing sides with a wafer holding member in the form of a comb having comb teeth with the same regular pitch as that of the alignment grooves, the slit between adjacent comb teeth, into which the periphery of the wafer is inserted, having a width somewhat larger than the thickness of the wafer but smaller than the width of the wafer alignment groove to decrease the shaky condition of the wafer material.

7 Claims, 6 Drawing Sheets

PIOR ART

DEVICE FOR PREVENTING CONTACTING OF WAFERS IN WAFER CASSETTE

BACKGROUND OF THE INVENTION

The present invention relates to a device for preventing wafer materials held in a wafer cassette from contacting with each other. More particularly, the invention relates to a device which is mountable on a wafer cassette holding a plurality of wafer materials, which is referred to simply as "cassette" hereinafter, with an object to prevent the wafer materials from contacting with adjacent wafer materials so that the wafer materials can be safely handled without troubles due to mechanical damage caused thereto by contacting with each other.

It is a remarkable trend in the technology of handling wafer materials or, in particular, semiconductor silicon wafers that the diameter of the silicon wafers is under continued increase from 6 inches to 8 inches and further to 12 inches so that warping of the silicon wafer is now a very important and difficult problem in the art of semiconductor industry. When a plurality of silicon wafers having such a large diameter are held in a cassette in an uprightly standing disposition in parallel to each other, contacting of adjacent wafers eventually takes place due to warping of the wafers resulting in mechanical damages such as chipping in the periphery of the wafers. This trouble can of course be obviated to some extent when a large space is provided between adjacent wafers, though with a disadvantage that the number of wafers which can be contained in a cassette is necessarily so decreased. Another problem to be considered is that, when a plurality of large silicon wafers are taken out of a cassette apart from the respective alignment grooves by an automatic wafer-handling machine, a large space to ensure lift-up movement of the machine arms must be left above the cassette so that the width of the alignment grooves is also increased as the diameter of the silicon wafer is increased, resulting in a shaky condition of the wafers held therein to increase the chance of contact between adjacent wafers. While a silicon wafer of a 12 inches diameter has a thickness of only 0.7 to 1.2 mm, for example, the cassette holding such large silicon wafers has alignment grooves each having a large width of 5.0 to 8.0 mm so that the silicon wafers held in such alignment grooves are unavoidably in a shaky condition and are subject to be mechanically damaged even by a very gentle contact with the adjacent wafers.

FIG. 7 of the accompanying drawings is a perspective view of a typical wafer carrier for storage and transportation of wafer materials laid flat on a side surface and disassembled into parts, of which the cassette A is provided on each of side surfaces thereof with wafer alignment grooves B1, B2 and, after a plurality of wafers (not shown in the figure) are inserted into the cassette A and held in the wafer alignment grooves B1, B2, wafer-pressing members C1, C2 are mounted onto the cassette A in the front and in the rear of the cassette A, respectively. The cassette A thus holding the wafers therein is then put into the carrier body D and a gasket member E is mounted on an engagement groove along the periphery of the carrier body D. A covering F is mounted thereon. The carrier body D and the covering F are tightly connected together by mounting clamping members H, H onto a pair of engagement ribs G, G provided on the carrier body D and the covering F.

When the wafers held in the wafer carrier as described above are taken out by hand, the clamping members H, H are first removed from the pair of the engagement ribs G, G and then the covering F is removed from the carrier body D. The cassette A taken out of the carrier body D is then set on a cassette-tilting apparatus and tilted thereon by an inclination angle of 15° to 75° followed by removal of a wafer-pressing member C1 before taking out the wafers one by one. This way of taking out wafers from the wafer carrier is naturally very troublesome with such a large number of manipulation steps.

Since the wafer alignment grooves B1, B2 provided on the cassette A each have a sufficiently large width as to leave play spaces on both sides of the wafer when a wafer material is put thereinto, the wafers inserted into the alignment grooves are necessarily in a remarkably shaky condition so that, as is illustrated in FIG. 6B, the wafers W are eventually brought into contact each with the other with a risk of mechanical damage when the wafers are held in an upright disposition. This problem of contacting of wafers W can be avoided when the wafers W are held not in an upright disposition but in a tilted disposition by a certain angle of inclination. This is the reason for the use of a wafer-tilting apparatus when wafers are to be taken out of a cassette.

SUMMARY OF THE INVENTION

The present invention accordingly has an object to provide a device for preventing contacting of wafer materials held in a cassette of a wafer carrier with which an increase is accomplished in the working efficiency by removing the above described difficulties when the wafers are to be taken out by hand.

Thus, the present invention provides a device made from a plastic resin for preventing wafer materials held in a cassette having wafer alignment grooves from contacting with each other, which comprises:

a rectangular supporting frame mountable on the cassette, of which two oppositely facing side members each have a wafer-holding member shaped in the form of a comb having an array of comb teeth inwardly directed and spaced at the same regular pitch as the pitch of the wafer alignment grooves of the cassette, each of the slits between two adjacent comb teeth having a width smaller than the width of the wafer alignment grooves.

It is preferable that the width of each slit between two adjacent comb teeth does not exceed one half of the pitch of spacing of the wafer alignment grooves, but that the width of each slit is at least 150% of the thickness of the wafer material to be inserted into the slit.

Further, the generally rectangular frame is provided with a plurality of connecting members for engagement with the cassette on the lower surface of the frame at a position in the vicinity of the base part of the comb teeth.

DETAILED DESCRIPTION OF THE PREFERRED EMBODIMENTS

In the following, a detailed description is given of the device of the present invention for preventing wafer materials held in a cassette from contacting each with the others by making reference to the accompanying drawings.

Figure 1A:
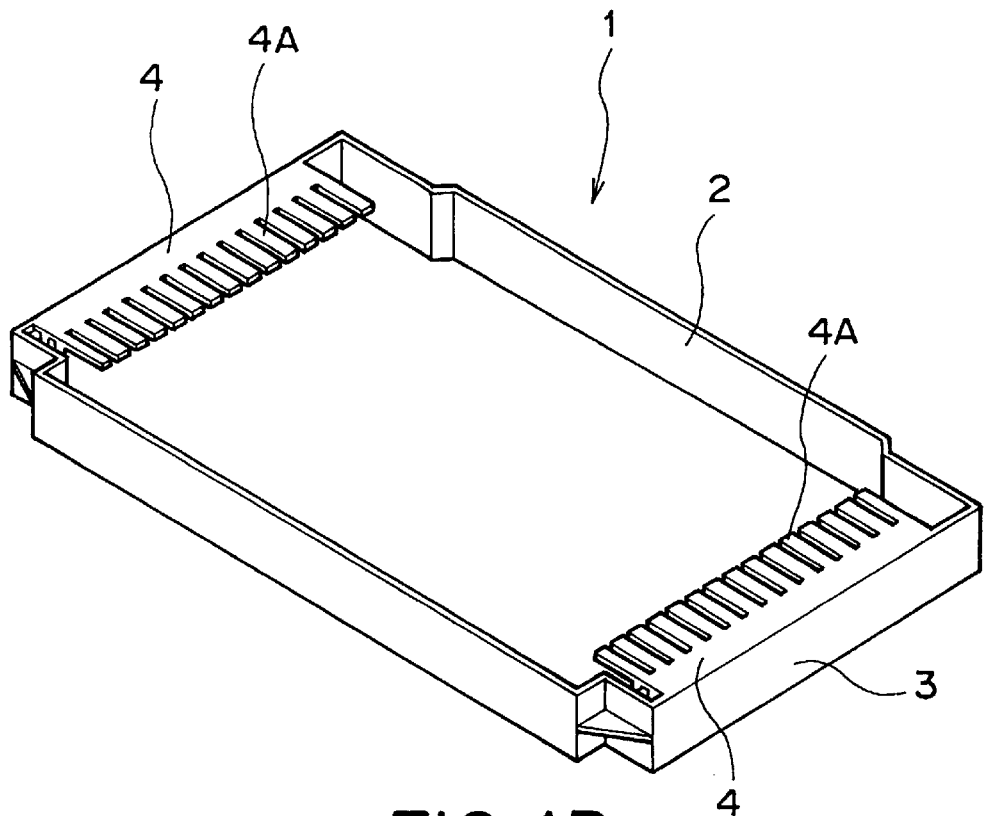
FIG. 1A is a perspective view of the inventive device as viewed from above.
Figure 1B:
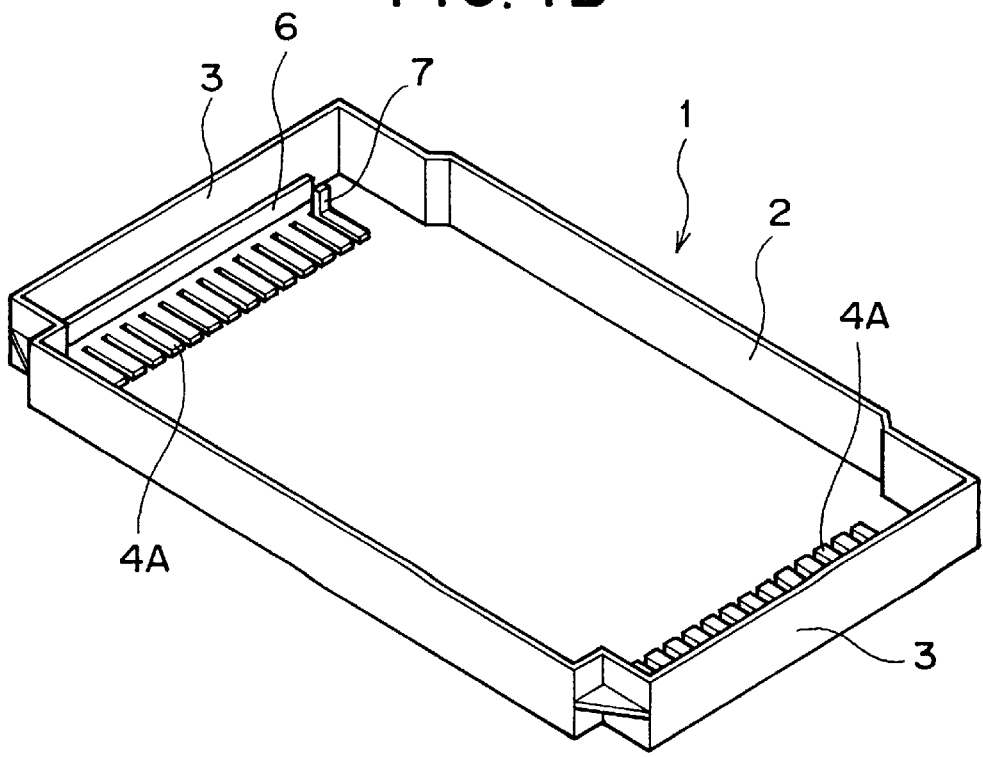
FIG. 1B is a perspective bottom view of the inventive device.

FIGS. 1A and 1B are each a perspective view of the inventive device as viewed from above and from below, respectively. The device 1 has a form of a generally rectangular member 2 of which two side members 3,3 oppositely facing in the direction of the longer side of the rectangular frame 2 are each provided on an upper end with a wafer-holding member 4 having a plurality of inwardly directed comb teeth 4A at a regular pitch.

Figure 2A:
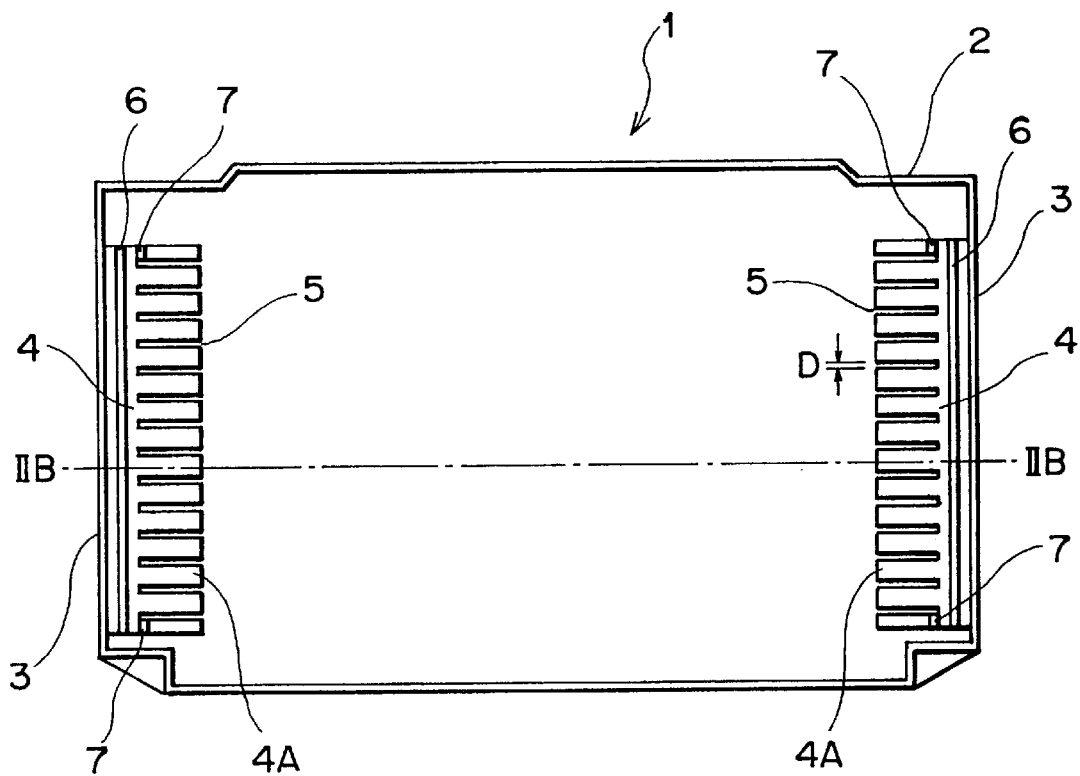
FIG. 2A is a plan view of the inventive device as viewed from below.
Figure 2B:
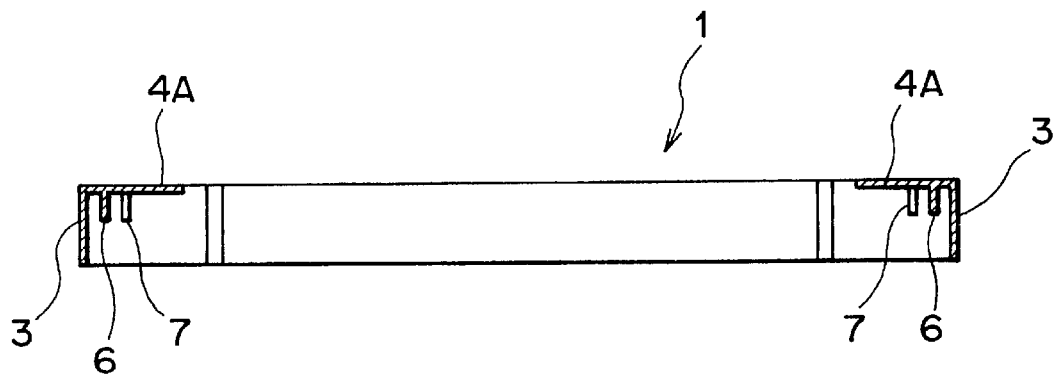
FIG. 2B is a cross sectional view of the inventive device as cut and viewed along the line IIB—IIB in FIG. 2A.

FIG. 2A is a plan view of the inventive device as viewed from below and FIG. 2B is a cross sectional view of the inventive device as cut and viewed along the line IIB—IIB indicated on FIG. 2A. As is shown in FIG. 2A, The pitch of spacing of the comb teeth 4A should be the same as the pitch of spacing of the wafer alignment grooves in the cassette, on which the inventive device is mounted, so as to ensure smooth insertion of the periphery of each wafer material held in the wafer alignment groove of the cassette into the slit 5 between two adjacent comb teeth 4A in the inventive device 1. The width D of the slit 5 between the comb teeth 4A preferably should not be smaller than 150% of the thickness of the wafer material to be inserted thereinto but should not exceed one half of the pitch of spacing of the wafer alignment grooves in the cassette on which the inventive device is to be mounted. When the width D of the slit 5 does not satisfy these requirements, tilting of the wafer materials is eventually caused when the upper wafer-pressing member is removed to cause contacting of the wafers resulting in mechanical damage thereto.

Further, each of the wafer-holding members 4,4 is provided on the lower surface with an engagement means composed of a downwardly extended rib 6 and downward protrusions 7,7 in the vicinity of the base of the comb teeth 4A. The inventive device 1 is mounted on a cassette, from which the wafer-pressing member is removed, by inserting the upper periphery of the cassette into the space formed between the rib 6 and the protrusions 7,7 to effect engagement therebetween.

Figure 3A:
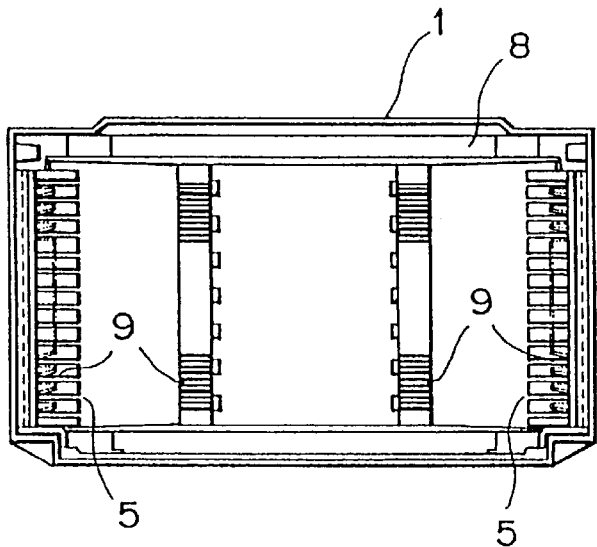
FIGS. 3A, 3B and 3C each show the inventive device as mounted on a cassette by a plan view, front view and side view, respectively.
Figure 3B:
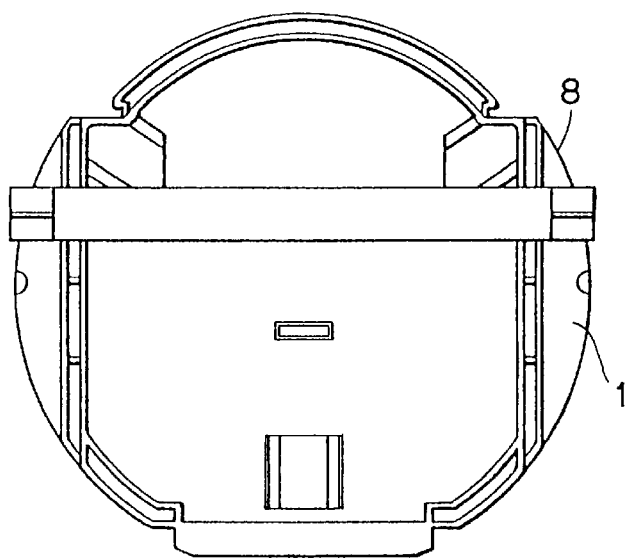
Figure 3C:
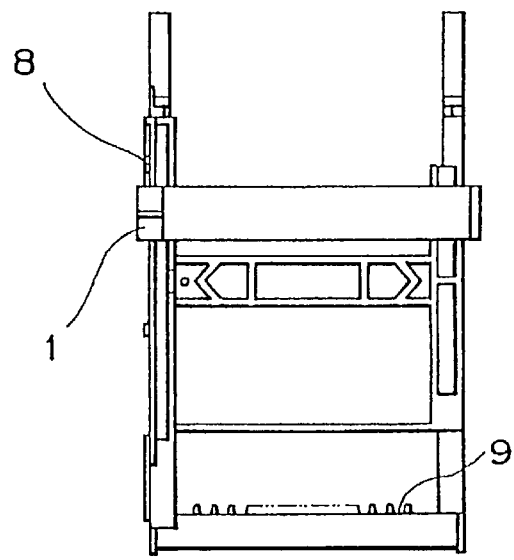

FIGS. 3A, 3B and 3C each illustrate the inventive device 1 as mounted on a cassette 8 by a plan view, front view and side view, respectively. Each of the wafer materials (not shown in these figures) is supported by inserting the periphery thereof into one of the slits 5 in the inventive device 1 and one of the wafer alignment grooves 9 in the cassette 8 within the same vertical plane. The upper wafer-pressing member is removed in these figures. In mounting the inventive device 1 on the cassette 8, the inventive device 1 is put from above onto the cassette 8 without the upper wafer-pressing member in such a fashion that the upper periphery of each of the side walls of the cassette 8 is inserted into the space between the downwardly extended rib 6 and protrusions 7,7 on the lower surface of the inventive device 1 to effect engagement therebetween.

Figure 4:
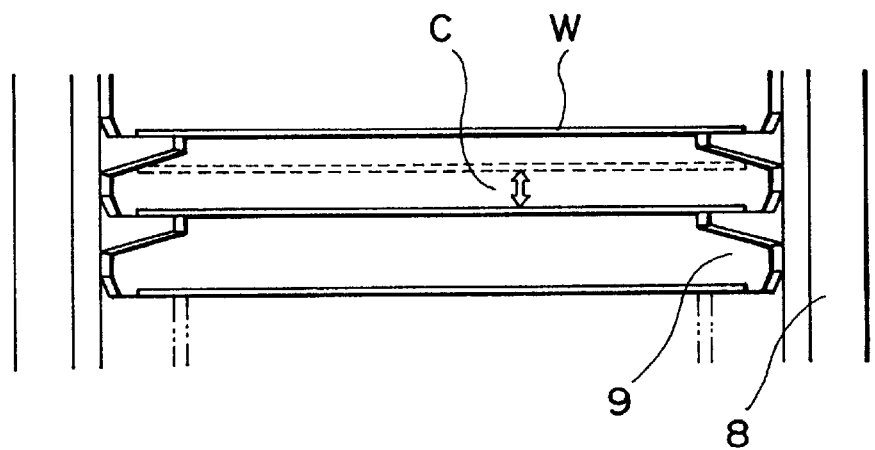
FIG. 4 is a schematic view for illustration of a shaky condition of wafer materials without the inventive device when a wafer pressing member is removed.
Figure 5:
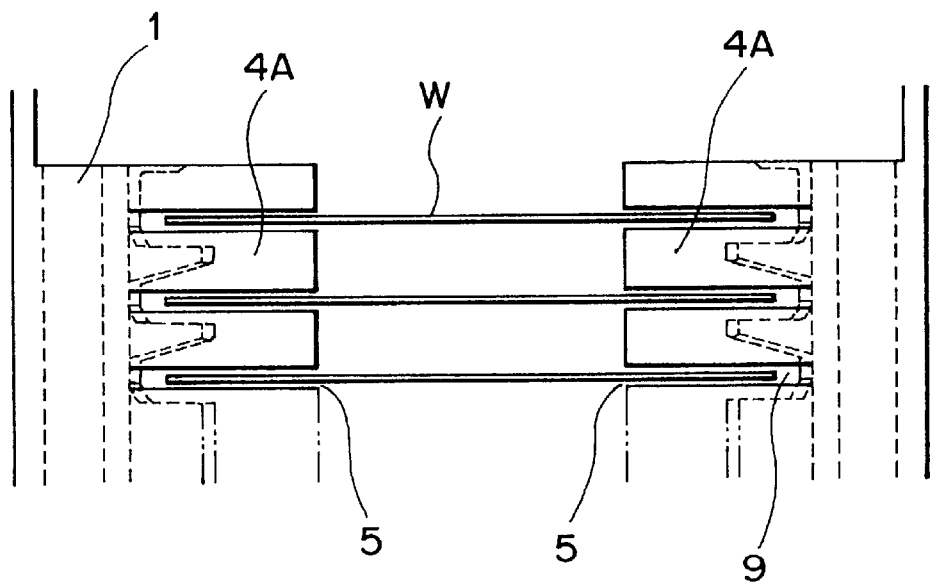
FIG. 5 is a schematic view for illustration of a stable condition of the wafer materials when the inventive device is mounted on the cassette.
Figure 6A:
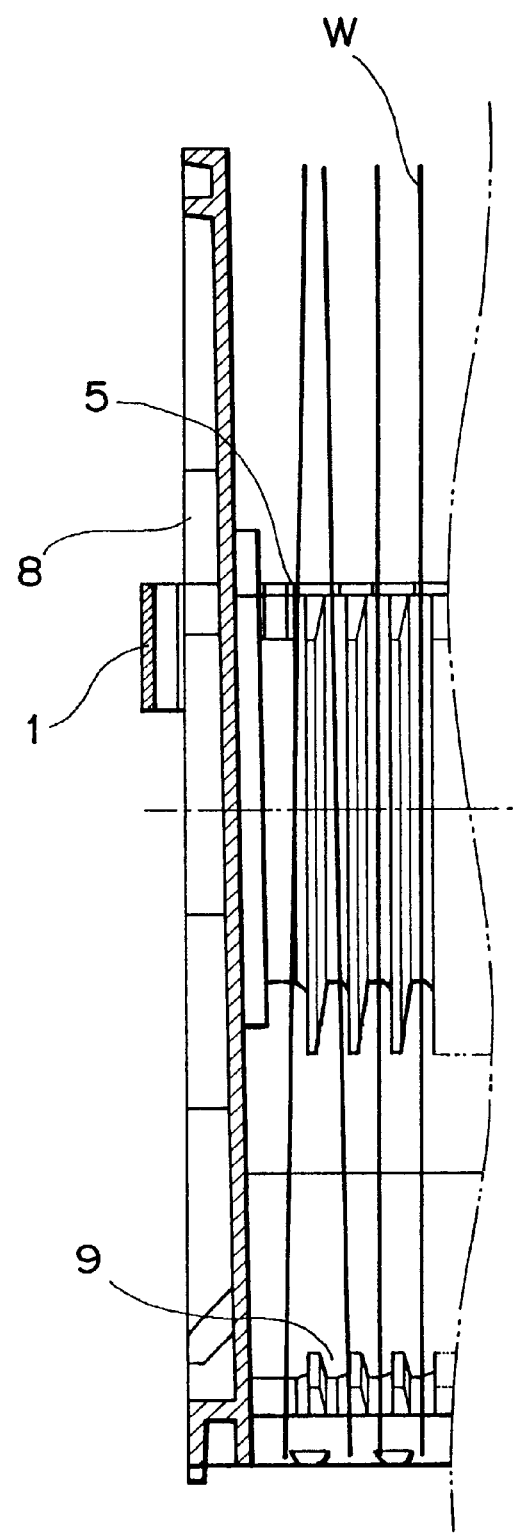
FIGS. 6A and 6B are each sectional views for illustration of the stable and shaky conditions of the wafer materials held in a cassette when the inventive device is mounted on the cassette and when the inventive device is removed from the cassette, respectively.
Figure 6B:
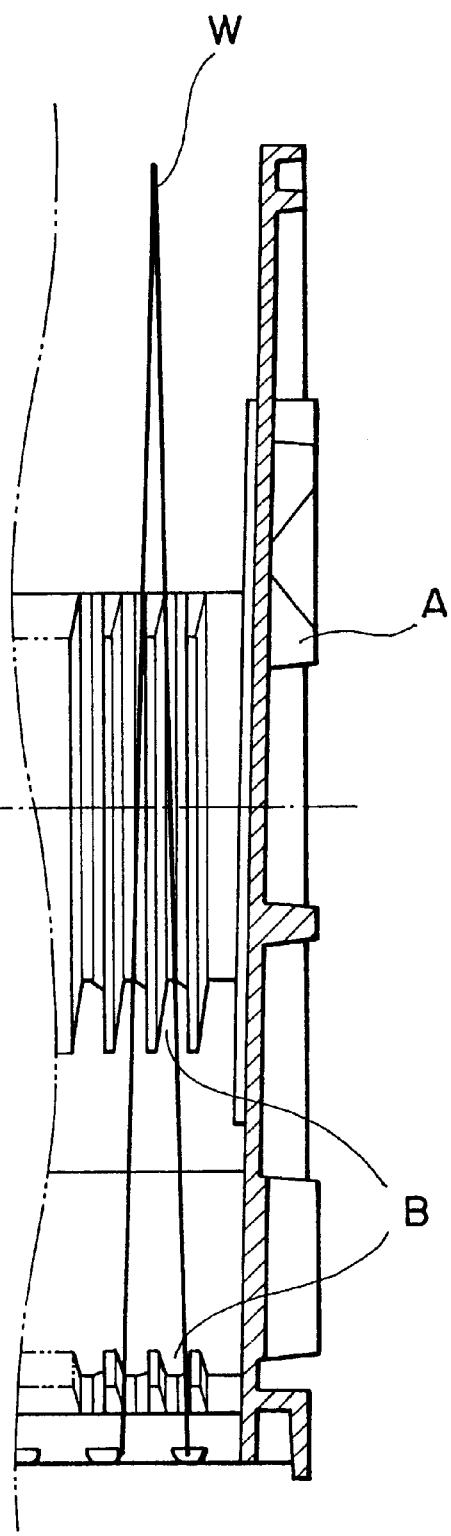
Figure 7:
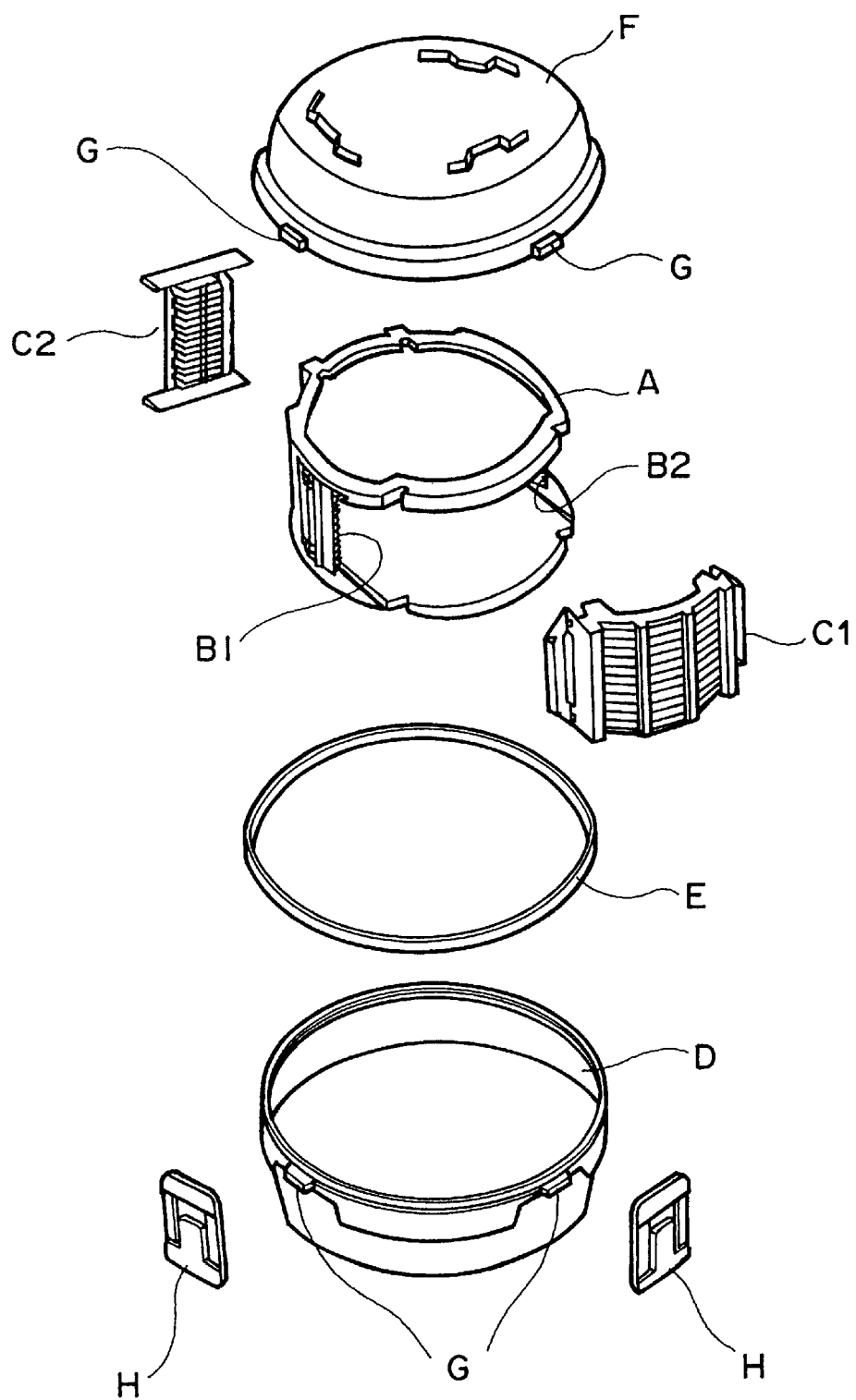
FIG. 7 is a perspective view of a wafer carrier as disassembled into parts.

FIG. 4 is a plan view illustrating the shaky condition of the wafer materials W held on a cassette 8 without mounting the inventive device when the upper wafer-pressing member is removed from the cassette 8. As is shown in this figure, the wafer material W is supported in the wafer alignment groove 9 with a play indicated by the double-sided broad arrow C. FIG. 5 is a similar plan view but with the inventive device 1 mounted on the cassette 8. Since the wafer material W is inserted into the slit 5 between two comb teeth 4A of the inventive device, the play C in FIG. 4 is now restricted by the width of the slit 5 which is substantially smaller than the width of the wafer alignment groove 9 so that the wafer materials W can be prevented from contacting with each other. Similarly, FIGS. 6A and 6B illustrate the stable and shaky conditions of the wafer materials W held on a cassette 8 with and without mounting, respectively, of the inventive device vertical cross section.

The inventive device is made from a thermoplastic resin such as polyolefins, e.g., polyethylene and polypropylene, ABS resins, polystyrene resins, polycarbonate resins, polybutylene terephthalate resins and the like or from a polyester-based, polyolefin-based or polystyrene based thermoplastic elastomer resin which may be colorless or colored or transparent, translucent or opaque. Such materials with the wafer material, not to cause mechanical damages thereto.

In the following, an example is given to illustrate the inventive device in more detail.

EXAMPLE

A cassette for wafer materials of 12-inches diameter having wafer alignment grooves each having a width of 6 mm at a pitch of 10 mm was held in a vertical disposition, from which the upper wafer-pressing member was removed. A contacting-preventing device according to the present invention made from a plastic resin was mounted on the cassette, and was a generally rectangular frame, as illustrated in FIGS. 1A, 1B, 2A and 2B, provided on the upper periphery of each of the oppositely facing side members along the shorter side with a comb-like wafer holding member. The comb teeth therein were arranged at a regular pitch of 10 mm with slits each having a width of 2.5 mm. The contacting-preventing device was secured to the wafer cassette by inserting the upper side wall peripheries of the cassette into the spaces between the downwardly extended rib and the protrusions. Thereafter, a plurality of silicon wafers each having a diameter of 12 inches and a thickness of 0.78 mm were mounted on the cassette by inserting the periphery of each wafer into one of the wafer alignment grooves and one of the slits between the comb teeth of the inventive device.

The result was that, even without mounting an upper wafer-pressing member, the wafers were secured in the alignment groove not in a shaky condition absolutely without any risk of contacting between adjacent wafers. Although the wafers could be transported with safety in the above described holding condition without the wafer-pressing member, safety for transportation of the wafers could be further improved by mounting the upper wafer-pressing member once removed before mounting of the inventive device.

What is claimed is:

1. A device, for use with a wafer cassette having wafer alignment grooves, for preventing wafer materials held in the wafer alignment grooves of the cassette from contacting each other, said device being formed of a plastic resin and comprising:

a rectangular supporting frame mountable on the wafer cassette and having two oppositely facing side members;

each said side member having extending therefrom a respective wafer-holding member having the shape of a comb and including an array of comb teeth directed inwardly;

said comb teeth of each said array being spaced at a regular pitch to be equal to a pitch between the wafer alignment grooves of the cassette; and adjacent said comb teeth being spaced by respective slits each having a width to be smaller than a width of the wafer alignment grooves.

2. A device as claimed in claim 1, further comprising an engagement structure, provided on a lower surface of each said wafer-holding member at a location adjacent a base of the respective said array of comb teeth thereof, to enable said device to be engaged with the wafer cassette.

3. A device as claimed in claim 1, wherein said plastic resin comprises a thermoplastic elastomer resin selected from the group consisting of polyester-based, polyolefin-based and polystyrene-based thermoplastic elastomer resins.

4. A method for preventing wafer materials, that are loaded into respective oppositely facing wafer alignment grooves formed in opposite side walls of a wafer cassette, with said wafer alignment grooves being spaced by a regular pitch, from contacting each other, said method comprising:

mounting on said wafer cassette a device formed of a plastic resin and comprising a rectangular supporting frame having two oppositely facing side members, each said side member having extending therefrom a respective wafer-holding member having the shape of a comb and including an array of comb teeth directed inwardly, said comb teeth of each said array being spaced at a regular pitch equal to said pitch between said wafer alignment grooves of said wafer cassette, and adjacent said comb teeth being spaced by respective slits each having a width smaller than a width of said wafer alignment grooves;

said mounting including positioning said device on an upper portion of said wafer cassette with an upper periphery of each said wafer material fitting into respective two oppositely facing slits of said wafer-holding members.

5. A method as claimed in claim 4, wherein each said slit has a width not smaller than 150% of the thickness of the respective said wafer material fitting therein and not exceeding 50% of said pitch of said alignment grooves.

6. A method as claimed in claim 4, wherein said mounting further includes engaging said wafer cassette with engagement structures provided on lower surfaces of respective said wafer-holding members adjacent bases of respective said arrays of comb teeth thereof.

7. A method as claimed in claim 4, wherein said plastic resin comprises a thermoplastic elastomer resin selected from the group consisting of polyester-based, polyolefin-based and polystyrene-based thermoplastic elastomer resins.

\* \* \* \* \*